US012562692B2

(12) United States Patent
Bae et al.

(10) Patent No.: US 12,562,692 B2
(45) Date of Patent: Feb. 24, 2026

(54) SEMICONDUCTOR DEVICE

(71) Applicant: SAMSUNG ELECTRONICS CO., LTD., Suwon-si (KR)

(72) Inventors: Jeong Yeol Bae, Suwon-si (KR); Jong Soo Lee, Suwon-si (KR); Duk Soo Kim, Suwon-si (KR); Eui Bong Yang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 434 days.

(21) Appl. No.: 18/216,133

(22) Filed: Jun. 29, 2023

(65) Prior Publication Data

US 2024/0072737 A1    Feb. 29, 2024

(30) Foreign Application Priority Data

Aug. 31, 2022    (KR) ......................... 10-2022-0109826

(51) Int. Cl.
| | |
|---|---|
| *H03F 1/02* | (2006.01) |
| *H03F 1/56* | (2006.01) |
| *H03F 3/72* | (2006.01) |
| *H04B 1/18* | (2006.01) |

(52) U.S. Cl.
CPC ................ *H03F 1/56* (2013.01); *H03F 3/72* (2013.01); *H04B 1/18* (2013.01); *H03F 2200/294* (2013.01); *H03F 2200/451* (2013.01); *H03F 2200/541* (2013.01); *H03F 2203/7209* (2013.01)

(58) Field of Classification Search
CPC ...................................... H03F 1/02; H03F 1/07
USPC ............................................. 330/124 R, 295
See application file for complete search history.

(56) References Cited

U.S. PATENT DOCUMENTS

| | | |
|---|---|---|
| 8,270,499 B2 | 9/2012 | Chang et al. |
| 8,831,551 B2 | 9/2014 | Lu et al. |
| 9,413,400 B1 | 8/2016 | Hedayati et al. |
| 9,774,485 B2 | 9/2017 | Tasic et al. |
| 11,005,513 B2 | 5/2021 | Bae et al. |
| 11,095,334 B1 | 8/2021 | Mohammadnezhad et al. |

FOREIGN PATENT DOCUMENTS

| | | |
|---|---|---|
| JP | 2011-199372 A | 10/2011 |

*Primary Examiner* — Henry Choe
(74) *Attorney, Agent, or Firm* — Sughrue Mion, PLLC

(57)    ABSTRACT

A semiconductor device includes a first Low Noise Amplifier (LNA), a second LNA, first and second receiving circuits, an a radio frequency multiplexer. The first LNA is connected to a first receiving port, and the second LNA is connected to a second receiving port different from the first receiving port. The first receiving circuit includes a first transformer and processes one or more outputs of the first and second LNAs. The second receiving circuit processes one or more of the outputs of the first and second LNAs. The radio frequency multiplexer controls connection between the first and second LNAs and the first and second receiving circuits. The first receiving circuit includes a first variable capacitor having a first end connected to an output of the radio frequency multiplexer and a second end connected to the first transformer.

20 Claims, 10 Drawing Sheets

<u>40</u>

<u>VC1</u>

40a

40b

SEMICONDUCTOR DEVICE

CROSS-REFERENCE TO RELATED APPLICATION

This application claims priority from Korean Patent Application No. 10-2022-0109826 filed on Aug. 31, 2022 in the Korean Intellectual Property Office and all the benefits accruing therefrom under 35 U.S.C. 119, the contents of which are herein incorporated by reference in its entirety.

BACKGROUND

The present disclosure relates to a semiconductor device.

Carrier aggregation (CA) has been introduced in a receiver of a communication device to enhance a data transmission rate. In the case that CA is used, since a bandwidth (BW) in which several signal bands may be simultaneously used by combination is widened, the amount of data that may be transmitted at a time is increased, and thus the data transmission rate may be increased.

Since frequency bands allocated to each country or each communication company of each country are different from each other, the receiver of the communication device should support all bands of various frequency bands. To this end, the receiver of the communication device may determine the number of receiving ports and the number of receiving circuits for processing a signal depending on required CA combination and carrier component (CC) characteristics, and then may connect the receiving port with the receiving circuit to perform signal processing.

In this case, since signal processing quality may be varied depending on a connection state between the receiving port and the receiving circuit, studies for improving signal processing quality will be required.

BRIEF SUMMARY

It is an aspect to provide a semiconductor device with improved signal processing performance.

According to some aspects of one or more embodiments, there is provided a semiconductor device comprises a first Low Noise Amplifier (LNA) connected to a first receiving port, a second LNA connected to a second receiving port different from the first receiving port, a first receiving circuit including a first transformer and configured to process at least one of outputs of the first and second LNAs, a second receiving circuit configured to process at least one of the outputs of the first and second LNAs, and a radio frequency (RF) multiplexer configured to control connections between the first and second LNAs and the first and second receiving circuits. The first receiving circuit includes a first variable capacitor having a first end connected to an output of the RF multiplexer and a second end connected to the first transformer.

According to some aspects of one or more embodiments, there is provided a semiconductor device comprises a first LNA connected to a first receiving port, a second LNA connected to a second receiving port different from the first receiving port, a first receiving circuit including a first transformer and configured to process at least one of outputs of the first and second LNAs, a second receiving circuit configured to process at least one of the outputs of the first and second LNAs, and an RF multiplexer configured to control connections between the first and second LNAs and the first and second receiving circuits, wherein the first receiving circuit includes a first capacitor having a first end connected to an output of the RF multiplexer and a second end connected to the first transformer, the first capacitor having a first capacitance, and the second receiving circuit includes a second capacitor having a first end connected to the output of the RF multiplexer and a second end connected to the second transformer, the second capacitor having a second capacitance different from the first capacitance.

According to some aspects of one or more embodiments, there is provided a semiconductor device comprising a first Low Noise Amplifier (LNA) connected to a first receiving port; a second LNA connected to a second receiving port different from the first receiving port; a first receiving circuit including a first transformer and configured to process at least one of outputs of the first LNA and the second LNA; a second receiving circuit configured to process at least one of the outputs of the first LNA and the second LNA; and an RF multiplexer configured to control connection between the first LNA and the second LNA and the first receiving circuit and the second receiving circuit. The first receiving circuit includes a second switch that transfers the output of the RF multiplexer to the first transformer through a first capacitor having a first capacitance; a third switch that transfers the output of the RF multiplexer to the first transformer through a second capacitor having a second capacitance different from the first capacitance; and a first switch that connects the output of the RF multiplexer to a second end of the first capacitor and to a second end of the second capacitor to bypass the first capacitor and the second capacitor.

BRIEF DESCRIPTION OF THE DRAWINGS

The above and other aspects will become more apparent by describing in detail exemplary embodiments thereof with reference to the attached drawings, in which.

DETAILED DESCRIPTION

The aspects of the present disclosure are not limited to those mentioned above and additional aspects, which are not mentioned herein, will be clearly understood by those skilled in the art from the following description of the present disclosure.

Hereinafter, various embodiments will be described with reference to the accompanying drawings.

Figure 1:
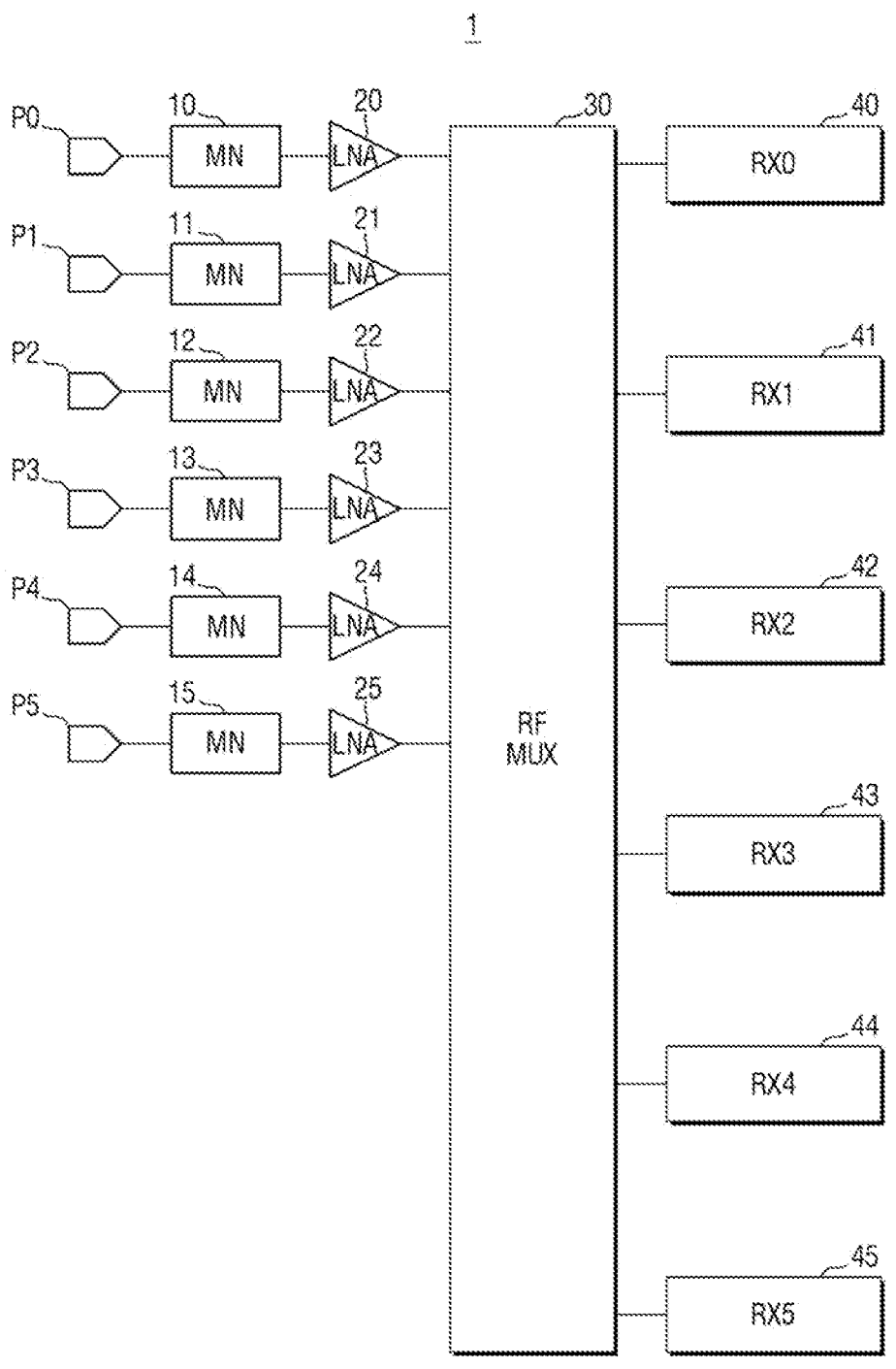
FIG. 1 is a view illustrating a semiconductor device according to some embodiments.

FIG. 1 is a view illustrating a semiconductor device according to some embodiments.

Referring to FIG. 1, a semiconductor device 1 may include a plurality of matching networks 10 to 15, a plurality of low noise amplifiers (LNAs) 20 to 25, a radio frequency multiplexer (RF MUX) 30, and a plurality of receiving circuits (RX0-RX5) 40 to 45. The semiconductor device 1 shown in FIG. 1 may be, for example, a receiving device of a communication device, but embodiments are not limited thereto.

The plurality of matching networks 10 to 15 may prevent signals received through a plurality of receiving ports P0 to P5 from being reflected, and may transfer the received signals to the plurality of LNAs 20 to 25, respectively.

In some embodiments, signals having different frequency bands may be received by the plurality of receiving ports P0 to P5, or signals having the same frequency band may be received by the plurality of receiving ports P0 to P5.

The plurality of LNAs 20 to 25 may amplify and output the signals received through the plurality of receiving ports P0 to P5, respectively.

The RF multiplexer (RF MUX) 30 may control a connection between the plurality of LNAs 20 to 25 and the plurality of receiving circuits 40 to 45. The number of LNAs 20 to 25 and the number of receiving circuits 40 to 45 may be determined to process the received signals in accordance with a carrier aggregation (CA) scenario, and the RF multiplexer 30 may connect the determined LNAs 20 to 25 with the determined receiving circuits 40 to 45, which will be used for signal processing in accordance with the scenario.

An example in which six LNAs 20 to 25 and six receiving circuits 40 to 45 are disposed in the semiconductor device 1 and the RF multiplexer 30 controls connection between the LNAs and the receiving circuits is illustrated in FIG. 1, but embodiments are not limited thereto. In some embodiments, various modifications may be made in the number of LNAs 20 to 25 and the number of receiving circuits 40 to 45.

The plurality of receiving circuits 40 to 45 may process the outputs of the plurality of LNAs 20 to 25. Hereinafter, an example of the receiving circuit will be described with reference to FIG. 2, but embodiments are not limited thereto.

Figure 2:
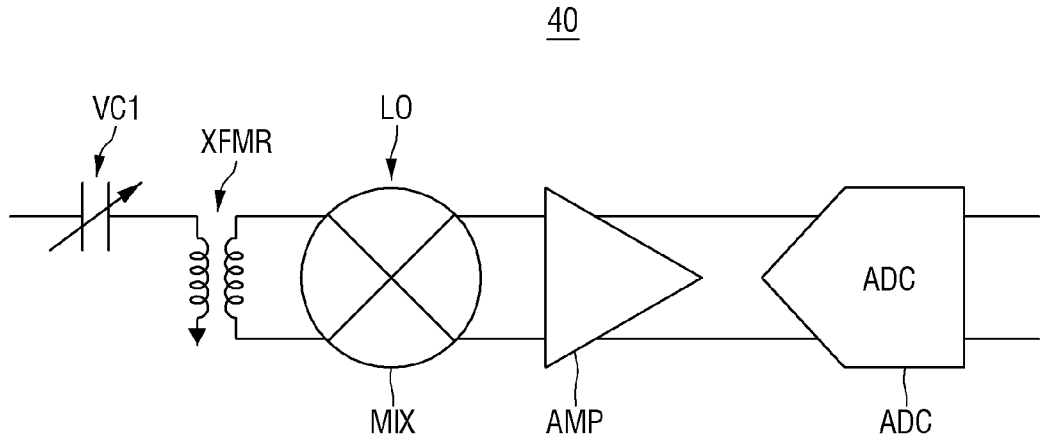
FIG. 2 is an exemplary view illustrating a receiving circuit of FIG. 1, according to some embodiments.

FIG. 2 is an exemplary view illustrating the receiving circuit of FIG. 1, according to some embodiments.

Referring to FIG. 2, the receiving circuit 40 may include a variable capacitor VC1, a transformer XFMR, a mixer MIX, a receiving amplifier AMP and an analog-to-digital converter ADC.

In some embodiments, the other receiving circuits (41 to 45 of FIG. 1), which are not shown in FIG. 2, may include the same elements as those of the receiving circuit 40. In some embodiments, the receiving circuit 40 may further include another element (e.g., filter), which is not shown.

Referring to FIGS. 1 and 2, a first end of the variable capacitor VC1 may be connected to an output of the RF multiplexer 30, and a second end of the variable capacitor VC1 may be connected to the transformer XFMR. That is, the variable capacitor VC1 may be connected in series between the transformer XFMR and the RF multiplexer 30 (or the LNA connected through the RF multiplexer 30).

The variable capacitor VC1 may be used to compensate for inductance according to a change in a line length in the RF multiplexer 30 used when the receiving circuit 40 is connected to the plurality of LNAs 20 to 25. This configuration and operation will be described later in more detail.

In some embodiments, a capacitance of the variable capacitor VC1 may be changed based on the frequency band of the signal processed by the receiving circuit 40. For example, when the receiving circuit 40 processes a signal having a first frequency band, the variable capacitor VC1 may have a first capacitance, and when the receiving circuit 40 processes a signal having a second frequency band different from the first frequency band, the variable capacitor VC1 may have a second capacitance. In some embodiments, when the receiving circuit 40 processes a signal having a third frequency band different from the first and second frequency bands, a capacitance value of the variable capacitor VC1 may be 0. The variable capacitor VC1 will be described later in more detail.

The transformer XFMR may be connected to the variable capacitor VC1. In some embodiments, the transformer XFMR may convert a single signal output from the LNAs 20 to 25 connected to the receiving circuit 40 into a differential signal. In some embodiments, the transformer XFMR may convert a current output from the LNAs 20 to 25 into the differential signal.

The mixer MIX may perform down-converting for the signal output from the transformer XFMR based on a local oscillator signal LO. The mixer MIX may generate an intermediate frequency (IF) signal by mixing a radio frequency (RF) signal output from the transformer XFMR with the local oscillator signal LO.

In some embodiments, the frequency band of the signal processed by the receiving circuit 40 may be determined based on the local oscillator signal LO provided to the mixer MIX. Therefore, when the local oscillator signal LO is a first signal, the variable capacitor VC1 may have a first capacitance, and when the local oscillator signal LO is a second signal, the variable capacitor VC1 may have a second capacitance. In some embodiments, when the local oscillator signal LO is a third signal, the capacitance value of the variable capacitor VC1 may be 0.

The receiving amplifier AMP may amplify the output of the mixer MIX. In some embodiments, the receiving amplifier AMP may include a trans-impedance amplifier TIA.

The analog-to-digital converter ADC may receive an analog signal output of the receiving amplifier AMP and perform analog-to-digital conversion for the analog signal output to output a digital signal.

Hereinafter, an exemplary configuration of the variable capacitor VC1 having a capacitance that is changed based on the frequency band of the signal processed by the receiving circuit 40 will be described with reference to FIG. 3, but embodiments are not limited thereto.

Figure 3:
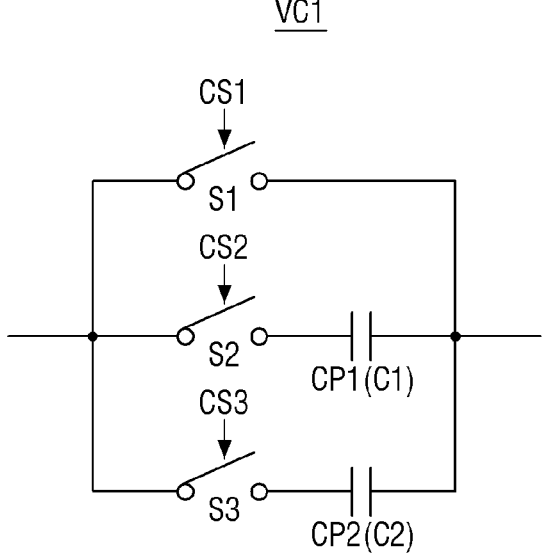
FIG. 3 is an exemplary view illustrating a variable capacitor of FIG. 1, according to some embodiments.

FIG. 3 is an exemplary view illustrating a variable capacitor of FIG. 1, according to some embodiments.

Referring to FIG. 3, the variable capacitor VC1 may include a plurality of switches S1 to S3, a first capacitor CP1, and a second capacitor CP2.

Referring to FIGS. 1 to 3, the switch S1 may be turned on or off by being controlled by a control signal CS1. The switch S1 may be turned on by the control signal CS1 to bypass the output of the RF multiplexer 30 to the transformer XFMR. In other words, the switch S1 may be turned on by the control signal CS1 in order to pass the output of the RF multiplexer 30 directly to the transformer XFMR without passing through the first capacitor CP1 or the second capacitor CP2.

The switch S2 may be turned on or off by being controlled by a control signal CS2. The switch S2 may be turned on by the control signal CS2 to connect a first end of the capacitor CP1 having a capacitance C1 to the output of the RF multiplexer 30. In this case, since a second end of the capacitor CP1 is connected to the transformer XFMR, the capacitor CP1 and the transformer XFMR may be connected to the output of the RF multiplexer 30 in series.

The switch S3 may be turned on or off by being controlled by a control signal CS3. The switch S3 may be turned on by the control signal CS3 to connect a first end of the capacitor CP2 having a capacitance C2 to the output of the RF multiplexer 30. In this case, since a second end of the capacitor CP2 is connected to the transformer XFMR, the capacitor CP2 and the transformer XFMR may be connected to the output of the RF multiplexer 30 in series.

In some embodiments, the capacitance C1 of the capacitor CP1 and the capacitance C2 of the capacitor CP2 may be different from each other. For example, the capacitance C1 of the capacitor CP1 may be 1 pF to 2 pF, and the capacitance C2 of the capacitor CP2 may be 3 pF to 4 pF, but embodiments are not limited thereto.

A value of the control signal CS1 for controlling the switch S1 may be changed based on the frequency band of the signal processed by the receiving circuit 40 or the local oscillator signal LO provided to the mixer MIX. For example, when the receiving circuit 40 processes the signal having the first frequency band or the local oscillator signal LO provided to the mixer MIX is the first signal, the control signal CS1 may have a value for turning on the switch S1.

A value of the control signal CS2 for controlling the switch S2 may be changed based on the frequency band of the signal processed by the receiving circuit 40 or the local oscillator signal LO provided to the mixer MIX. For example, when the receiving circuit 40 processes the signal having the second frequency band or the local oscillator signal LO provided to the mixer MIX is the second signal, the control signal CS2 may have a value for turning on the switch S2.

A value of the control signal CS3 for controlling the switch S3 may be changed based on the frequency band of the signal processed by the receiving circuit 40 or the local oscillator signal LO provided to the mixer MIX. For example, when the receiving circuit 40 processes the signal having the third frequency band or the local oscillator signal LO provided to the mixer MIX is the third signal, the control signal CS3 may have a value for turning on the switch S3. In some embodiments, the first through third frequency bands may be different from each other. In some embodiments, the first through third signals maybe different from each other.

Hereinafter, a function of the variable capacitor VC1 will be described later in more detail with reference to FIGS. 4 to 13.

FIGS. 4 to 13 are views illustrating a function of a variable capacitor of FIG. 1, according to some embodiments.

Figure 4:
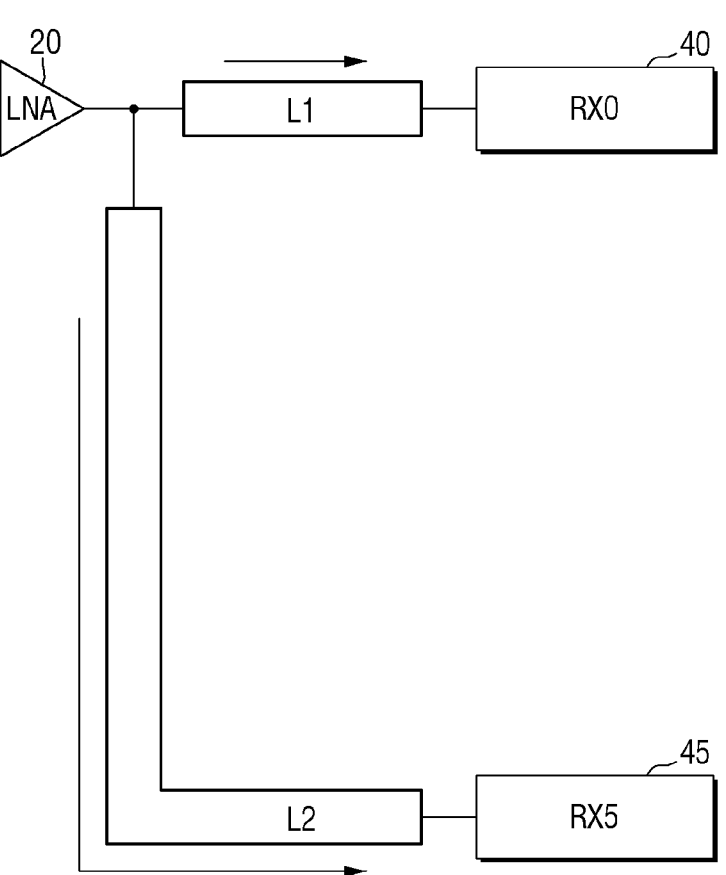
FIGS. 4 to 13 are views illustrating a function of a variable capacitor of FIG. 1, according to some embodiments.

Referring to FIG. 4, in accordance with a CA scenario, the LNA 20 may be connected to the receiving circuit 40 by the RF multiplexer (30 of FIG. 1), or may be connected to the receiving circuit 45.

In accordance with the arrangement of the receiving circuit 40 and the receiving circuit 45 in a chip, the LNA 20 and the receiving circuit 40 may be connected to each other using a line L1, and the LNA 20 and the receiving circuit 45 may be connected to each other using a line L2.

Since a physical distance in the chip from the LNA 20 to the receiving circuit 40 is different from a physical distance in the chip from the LNA 20 to the receiving circuit 45, a length of the line L1 and a length of the line L2 may be different from each other.

Although FIG. 4 shows an example in which the length of the line L1 is relatively short and the length of the line L2 is relatively long, this is only an example and the line lengths may be varied differently depending on the arrangement of the plurality of receiving circuits 40 to 45 in the chip.

When the line lengths are different from each other as described above, inductance may be varied depending on the line lengths.

The following Table 1 shows an example of a difference in inductance when the transformer XFMR included in each receiving circuit is viewed from the output of the LNA 20 in accordance with the line lengths illustrated in FIG. 4.

TABLE 1

| Line | Inductance (nH) |
|---|---|
| L1 | 0.06 @ 2 GHz, 0.06 @ 3 GHz |
| L2 | 0.96 @ 2 GHz, 0.97 @ 3 GHz |

Referring to Table 1, it is noted that an inductance difference of about 1 nH occurs between the case that the LNA and the receiving circuit are connected to each other using the long line L2 and the case that the LNA and the receiving circuit are connected to each other using the short line L1.

The following Table 2 shows inductance of a primary coil when a 2 GHz band signal of a Mid High Band (MHB) transformer is processed (@ 2 GHz) and inductance of a primary coil when a 3 GHz band signal is processed (@ 3 GHz).

TABLE 2

| Transformer | Inductance (nH) |
|---|---|
| MHB | 1.48 @ 2 GHz, 1.53 @ 3 GHz |

According to comparison between Table 1 and Table 2, when the RF multiplexer (30 of FIG. 1) connects the LNA with the receiving circuit by using the short line L1, it may not greatly affect signal processing performance because the inductance of the line L1 is not greater than that of the transformer of the receiving circuit. However, when the RF multiplexer (30 of FIG. 1) connects the LNA with the receiving circuit by using the long line L2, it may greatly affect signal processing performance because the inductance of the line L2 is also very great as compared with the inductance of the transformer of the receiving circuit.

That is, since there is a difference in load impedance between two paths viewed from the LNA output when the LNA and the receiving circuit are connected to each other using the line L1 and when the LNA and the receiving circuit are connected to each other using the line L2, signal processing performance may be different for each of the case that signal processing is performed using the line L1 and the case that signal processing is performed using the line L2.

Figure 5:
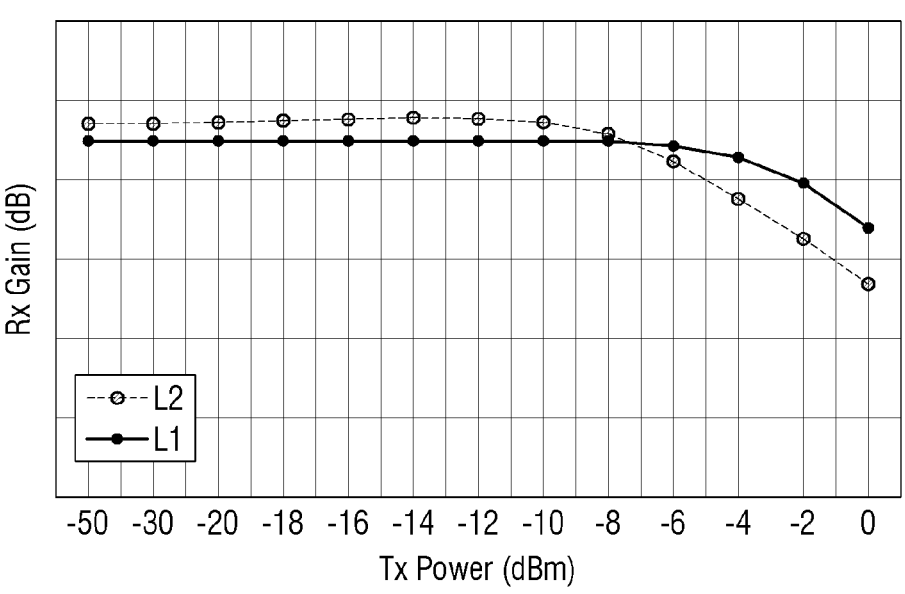
Figure 7:
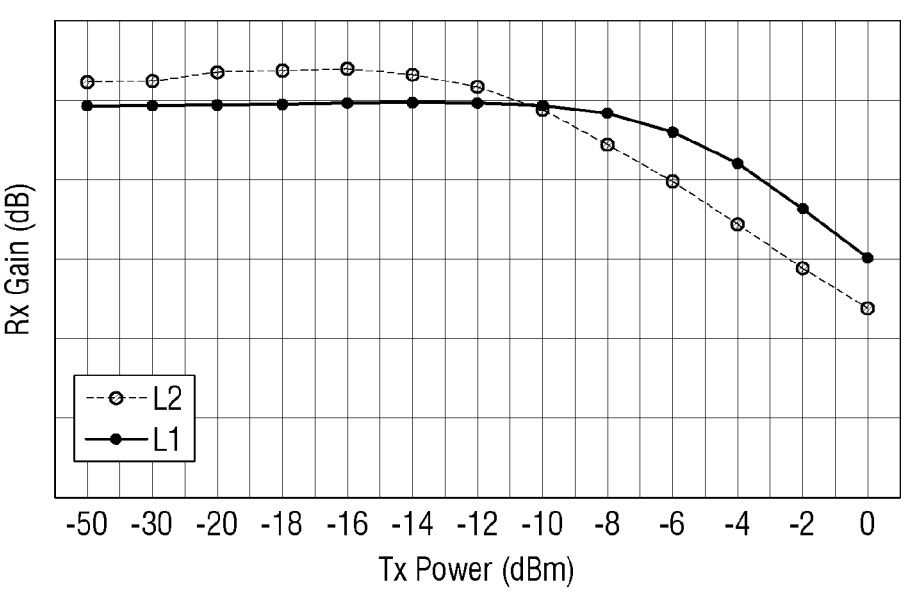

FIG. 5 is a graph illustrating an Rx Gain according to an increase in a Tx Power when a signal of a frequency band 'A' is processed in the case that the variable capacitor (VC1 of FIG. 2) is not present. FIG. 7 is a graph illustrating an Rx Gain according to an increase in a Tx Power when a signal of a frequency band 'B' is processed in the case that the variable capacitor (VC1 of FIG. 2) is not present.

Referring to FIGS. 5 and 7, it is noted that the Rx gain when the line L1 is used is different from the Rx gain when the line L2 is used. In particular, as the relatively long line L2 is used as described above, the Rx gain is increased due to the increase of the LNA output impedance, and thus the Tx power is increased, whereby it is noted that the Rx gain is more quickly saturated.

Figure 6:
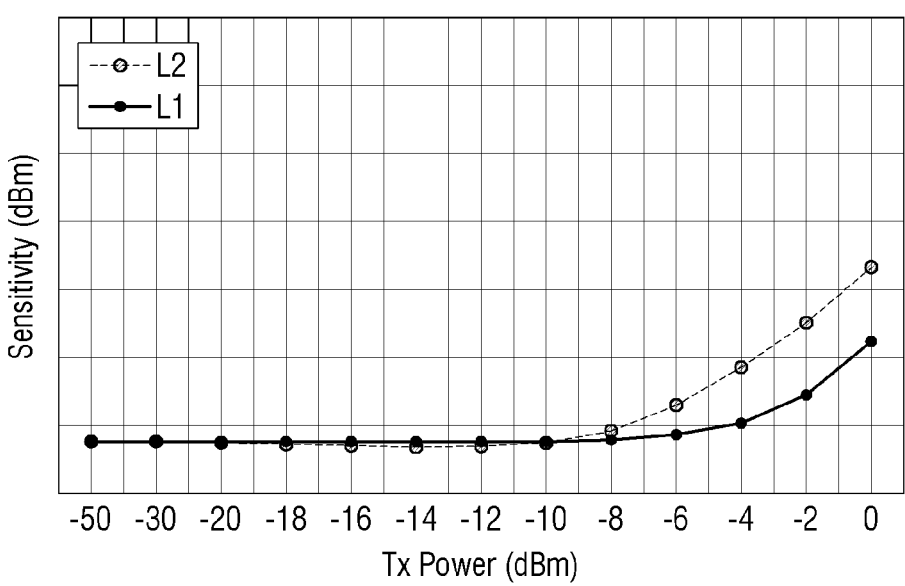
Figure 8:
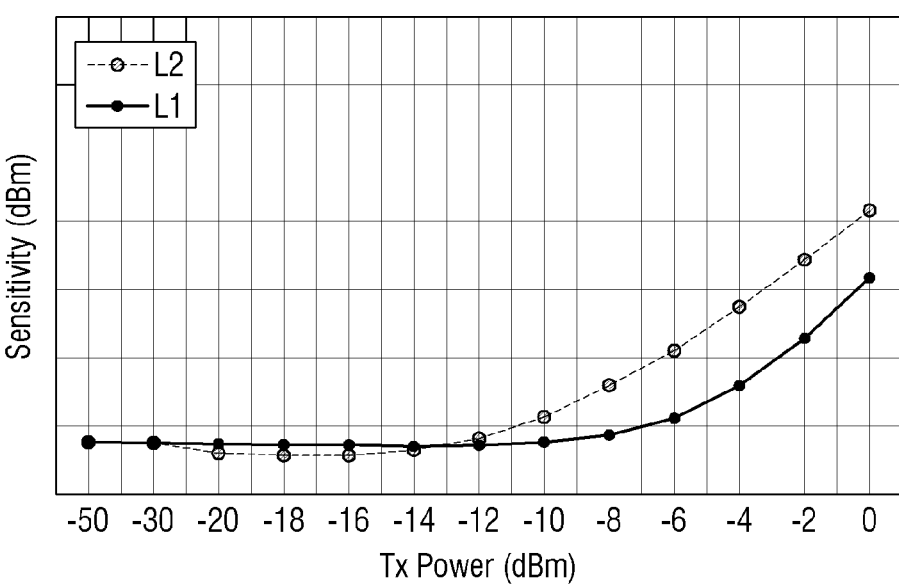

FIG. 6 is a graph illustrating sensitivity performance according to an increase in a Tx Power when a signal of a frequency band 'A' is processed in the case that the variable capacitor (VC1 of FIG. 2) is not present. FIG. 8 is a graph illustrating sensitivity performance according to an increase in Tx Power when a signal of a frequency band 'B' is processed in the case that the variable capacitor (VC1 of FIG. 2) is not present.

Referring to FIGS. 6 and 8, it is noted that sensitivity is also different for each of the case that the line L1 and the case that the line L2 is used, due to a drop phenomenon of the Rx gain described above. That is, even though the same Tx power is received, it is noted that Desense performance (e.g., the degree of deterioration of sensitivity due to noise) of the relatively long line L2 is not good.

The semiconductor device 1 according to some embodiments may include a variable capacitor connected in series between the LNA and the transformer in the receiving circuit in order to avoid deterioration of signal processing performance according to the line length. The capacitance of the variable capacitor is changed based on the frequency band of the signal processed by the receiving circuit. Therefore, the capacitance of the variable capacitor in each receiving circuit may have a value different from that of another variable capacitor in each receiving circuit as shown in FIG. 9.

Figure 9:
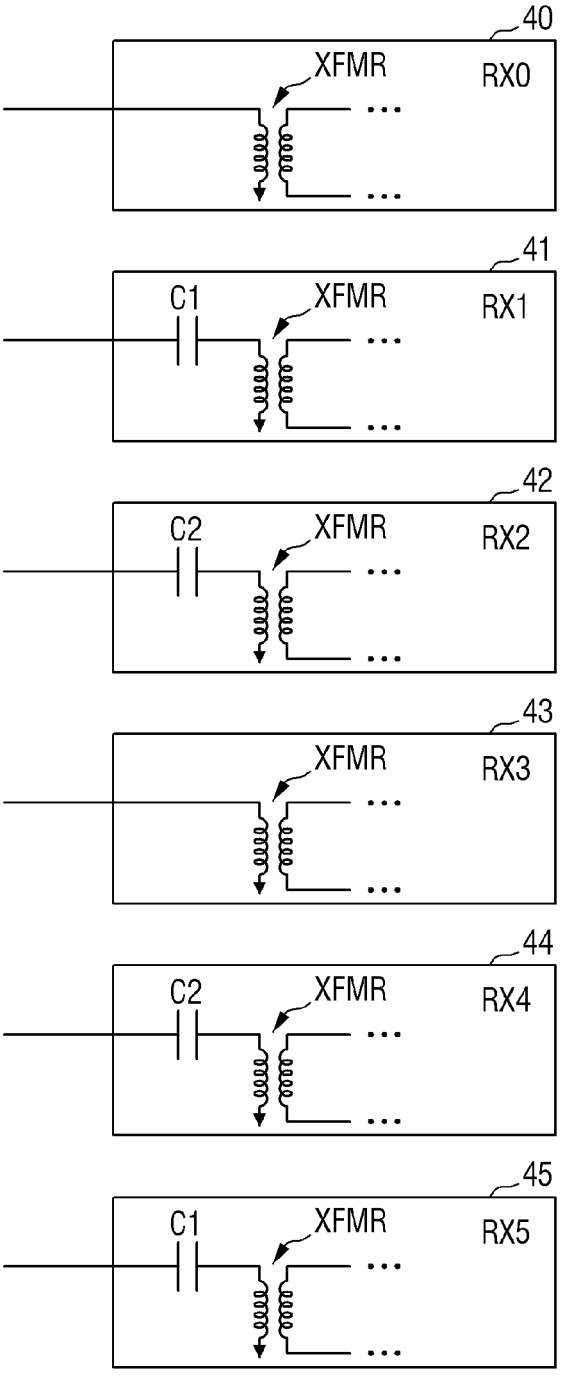

For example, referring to FIG. 9, the receiving circuit (RX2) 42 and the receiving circuit (RX4) 44 may be set to process the signal of the frequency band 'A' so that the variable capacitor may have a capacitance C2, the receiving circuit (RX1) 41 and the receiving circuit (RX5) 45 may be set to process the signal of the frequency band 'B' so that the variable capacitor may have a capacitance C1, and the receiving circuit (RX0) 40 and the receiving circuit (RX3) 43 may be set to process a signal of a frequency band 'C' so that the receiving circuits may perform a bypass operation.

In some embodiments, signal processing performance of the semiconductor device 1 may be improved in accordance with the above configuration illustrated in FIGS. 2-3.

For example, when the receiving circuit (RX2) 42 and the receiving circuit (RX4) 44 process the signal of the frequency band 'A', even though the length of the line L2 connecting the LNA with the receiving circuit (RX4) 44 is longer than the length of the line L1 connecting the LNA with the receiving circuit (RX2) 42, inductance related to the line in the RF multiplexer may be removed due to the presence of the capacitor having the capacitance C2.

Figure 10:
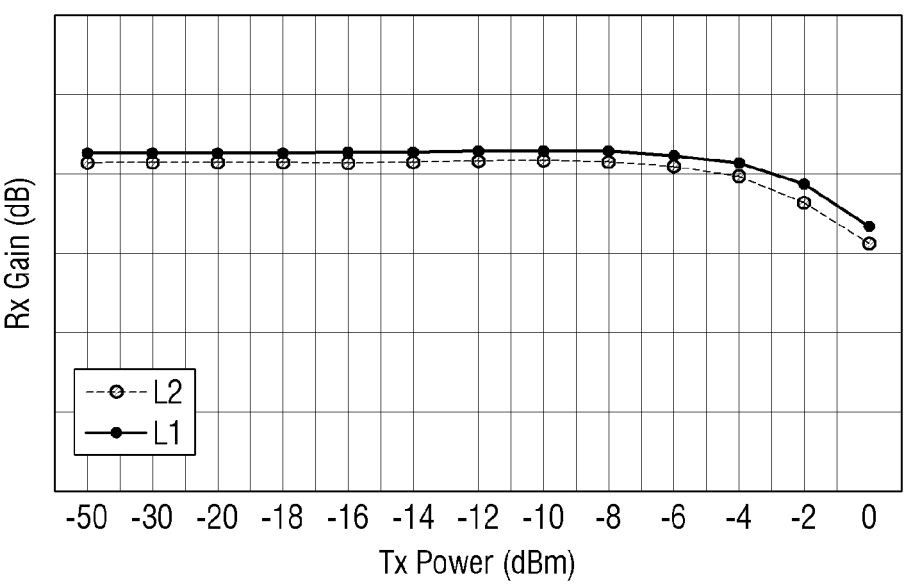
Figure 11:
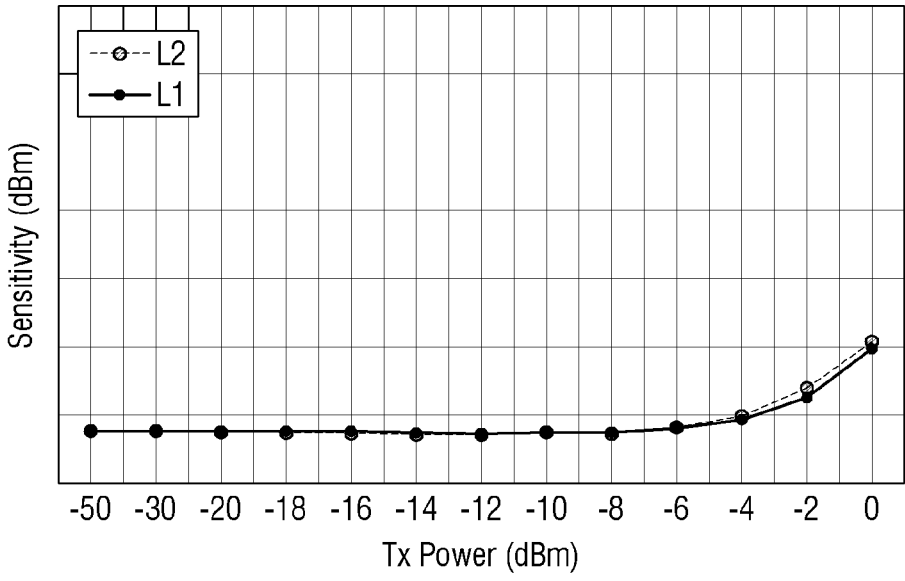

Therefore, as shown in FIG. 10, a difference in the Rx gain due to the line length is almost eliminated, and as shown in FIG. 11, a difference in sensitivity performance due to the line length may be almost eliminated.

Also, for example, when the receiving circuit (RX1) 41 and the receiving circuit (RX5) 45 process the signal of the frequency band 'B', even though the length of the line L2 connecting the LNA with the receiving circuit (RX5) 45 is longer than the length of the line L1 connecting the LNA with the receiving circuit (RX1) 41, inductance related to the line in the RF multiplexer may be removed due to the presence of the capacitor having the capacitance C1.

Figure 12:
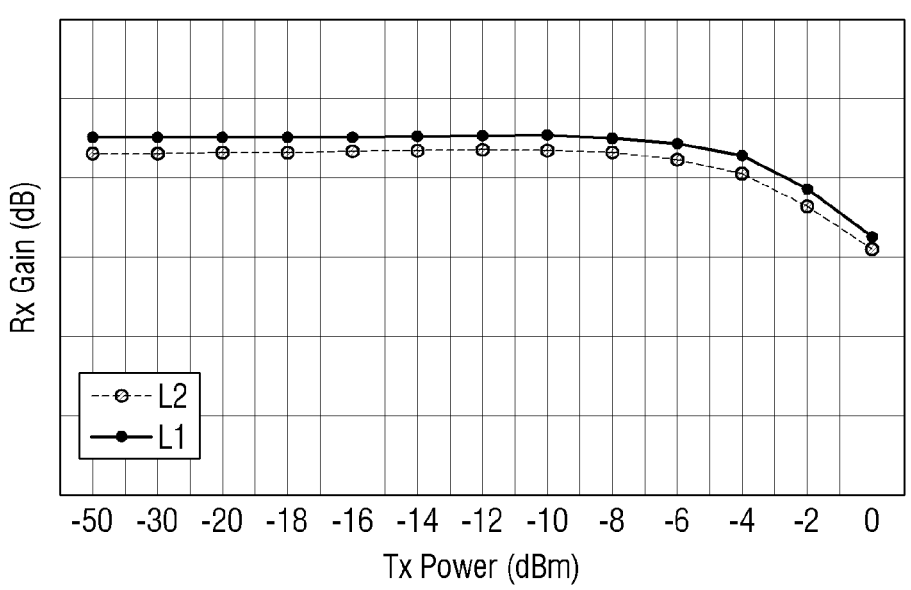
Figure 13:
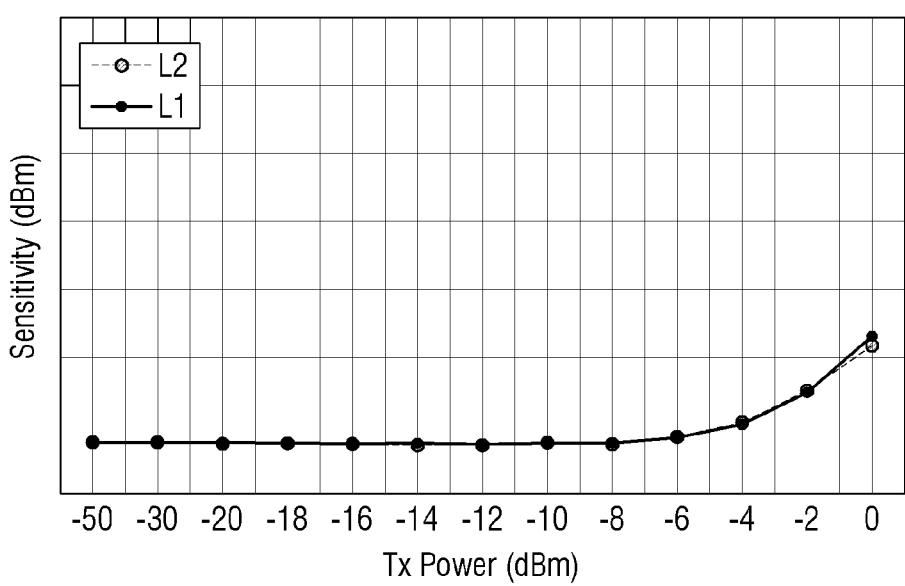

Therefore, as shown in FIG. 12, a difference in the Rx gain due to the line length is almost eliminated, and as shown in FIG. 13, a difference in sensitivity performance due to the line length may be almost eliminated. In other words, signal processing performance of the semiconductor device may be improved.

Figure 14:
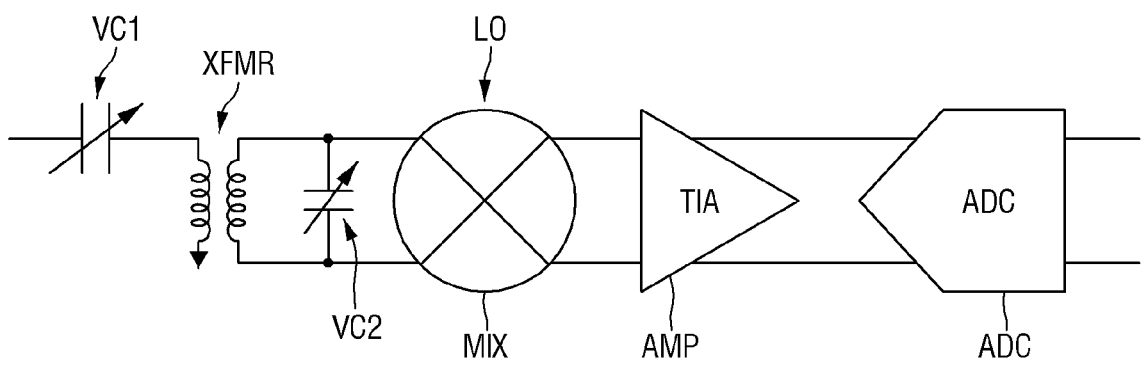
FIG. 14 is a view illustrating a semiconductor device according to some other embodiments.

FIG. 14 is a view illustrating a semiconductor device according to some other embodiments.

Hereinafter, a redundant description to that of FIGS. 2-3 will be omitted for conciseness, and the following description will be based on differences from FIGS. 2-3.

Referring to FIG. 14, a receiving circuit 40a may further include a variable capacitor VC2. As shown, the variable capacitor VC2 may be connected between output ends of the transformer XFMR.

The variable capacitor VC2 performs a function different from the function of the variable capacitor VC1. As described above, the variable capacitor VC1 performs a function of compensating for an inductance difference due to a difference in the line length in the RF multiplexer 30, but the variable capacitor VC2 may be used to adjust a tuning range of the transformer XFMR.

Figure 15:
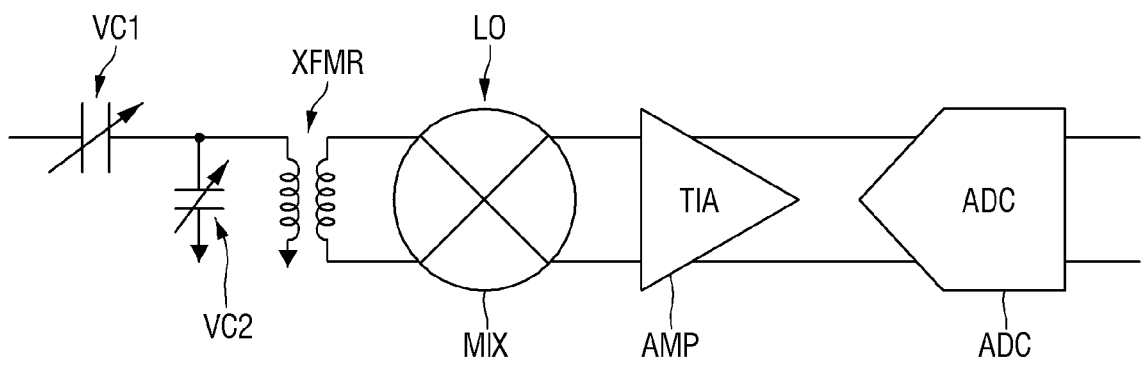
FIG. 15 is a view illustrating a semiconductor device according to some other embodiments.

FIG. 15 is a view illustrating a semiconductor device according to some other embodiments.

Hereinafter, a redundant description to that of FIGS. 2-3 and 14 will be omitted for conciseness, and the following description will be based on differences from FIGS. 2-3 and 14.

Referring to FIG. 15, a receiving circuit 40b may further include a variable capacitor VC2. As shown, a first end of the variable capacitor VC2 may be connected to the transformer XFMR and a second end of the variable capacitor VC2 may be grounded. That is, the variable capacitor VC1 is connected in series with the transformer XFMR, but the variable capacitor VC2 may be connected in parallel to the transformer XFMR.

The variable capacitor VC2 performs a function different from the function of the variable capacitor VC1. As described above, the variable capacitor VC1 performs a function of compensating for an inductance difference due to a difference in the line length in the RF multiplexer 30, but the variable capacitor VC2 may be used to adjust a tuning range of the transformer XFMR.

Figure 16:
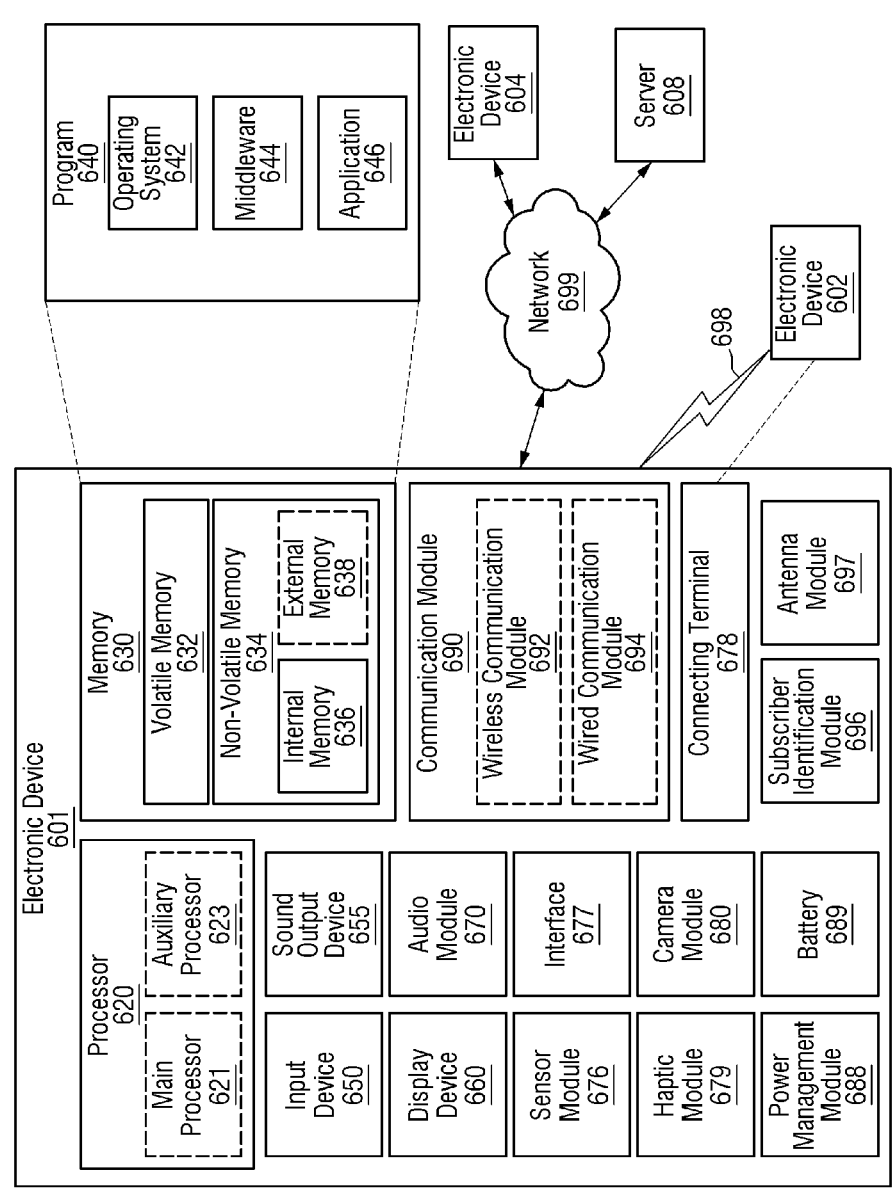
FIG. 16 is a block diagram illustrating an electronic device in a network environment according to some embodiments.

FIG. 16 is a block diagram of an electronic device in a network environment according to some embodiments.

An electronic device 601 in a network environment 600 may perform communication with an electronic device 602 through a first network 698 such as a short-range wireless communication network, or may perform communication with an electronic device 604 or a server 608 through a second network 699 such as a long-range wireless communication network.

The electronic device 601 may perform communication with the electronic device 604 through the server 608. The electronic device 601 includes a processor 620, a memory 630, an input device 650, a sound output device 655, a display device 660, an audio module 670, a sensor module 676, an interface 677, a connecting terminal 678, a haptic module 679, a camera module 680, a power management module 688, a battery 689, a communication module 690 and a subscriber identification module (SIM) 696, an antenna module 697 or the like.

In some embodiments, at least one of the components such as the display device 660 and the camera module 680 may be omitted from the electronic device 601, or one or more other components may be added to the electronic device 601.

In some embodiments, some of the components may be integrated into a single integrated circuit (IC). For example, the sensor module 676 such as a fingerprint sensor, an iris sensor and an illuminance sensor may be embedded in an image display device such as a display.

The processor 620 may perform a variety of data processing or computations by executing software (e.g., program 640) for controlling other components of at least one electronic device 601 such as hardware or software components connected to the processor 620.

As at least a portion of data processing or computations, the processor 620 may load commands or data received from another component such as the sensor module 676 or the communication module 690 in a volatile memory 632, process the commands or data stored in the volatile memory 632 and store result data in a non-volatile memory 634.

The processor 620 may include a main processor 621 such as a central processing unit (CPU) or an application processor (AP), and an auxiliary processor 623 operated independently of the main processor 621 or operated as being associated with the main processor 621.

The auxiliary processor 623 may include, for example, a graphic processing unit (GPU), an image signal processor (ISP), a sensor hub processor or a communication processor (CP).

In some embodiments, the auxiliary processor 623 may be configured to consume less power than the main processor 621 or execute a particular function. The auxiliary processor 623 may be implemented separately from the main processor 621 or implemented as a portion of the main processor 621.

The auxiliary processor 623 may control at least some of functions or states related to at least one of the components of the electronic device 601 on behalf of the main processor 621 while the main processor 621 is in an inactive state or together with the main processor 621 while the main processor 621 is in an active state.

The memory 630 may store various data used for at least one component of the electronic device 601. The data may include, for example, software of the program 640, and input data and output data for commands related to the software. The memory 630 may include a volatile memory 632 or a non-volatile memory 634.

The program 640 may be stored as software in the memory 630, and may include, for example, an operating system (OS) 642, a middleware 644, or an application 646.

The input device 650 may receive commands or data to be used for the component (e.g., the processor 620) of the electronic device 601 from the outside (e.g., user) of the electronic device 601. The input device 650 may include, for example, a microphone, a mouse, or a keyboard, and the input device 650 may include a plurality of microphones (10 and 12 of FIG. 1) described above.

The sound output device 655 may output a sound signal to the outside of the electronic device 601. The sound output device 655 may include, for example, a speaker. Multimedia data may be output through the speaker.

The display device 660 may visually provide information to the outside of the electronic device 601. The display device 660 may include, for example, a display, a hologram device or a projector, and a control circuit for controlling a corresponding one of the display, the hologram device or the projector.

In some embodiments, the display device 660 may include a touch sensor configured to sense a touch, or a sensor circuit, such as a pressure sensor, configured to measure intensity of a force generated by the touch.

The audio module 670 may convert sound into an electrical signal, or vice versa. In some embodiments, the audio module 670 may obtain sound via the input device 650, or may output sound via the sound output device 655 or the external electronic device 602 directly or wirelessly connected to the electronic device 601.

The sensor module 676 may sense an operating state (e.g., power or temperature) of the electronic device 601 or an external environment state (e.g., user state) of the electronic device 601, and may generate an electrical signal or data value corresponding to the sensed state. The sensor module 676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 677 may support one or more designated protocols to be used by the electronic device 601 directly or wirelessly connect to the external electronic device 602. In some embodiments, the interface 677 may include, for example, a high definition multimedia interface (HDMI), a universal serial bus (USB) interface, a secure digital (SD) card interface, or an audio interface.

The connecting terminal 678 may include a connector through which the electronic device 601 may be physically connected to the external electronic device 602. In some embodiments, the connecting terminal 678 may include, for example, an HDMI connector, a USB connector, an SD card connector, or an audio connector (e.g., a headphone connector).

The haptic module 679 may convert an electrical signal into a mechanical stimulus, such as vibration or motion, which may be recognized by a user, through a tactile sensation or kinesthetic sensation. In some embodiments, the haptic module 679 may include, for example, a motor, a piezoelectric element, or an electrical stimulator.

The camera module 680 may capture a still image and motion images. In some embodiments, the camera module 680 may include one or more lenses, an image sensor, an image signal processor, or a flash.

The power management module 688 may manage a power supplied to the electronic device 601. For example, the power management module 688 may be implemented as at least a portion of a power management integrated circuit (PMIC), for example.

The battery 689 may supply a power to at least one component of the electronic device 601. According to some embodiments, the battery 689 may include, for example, a non-rechargeable primary battery, a rechargeable secondary battery, or a fuel cell.

The communication module 690 may support establishment of a direct communication channel or wireless communication channel between the electronic device 601 and the external electronic device (e.g., the electronic device 602, the electronic device 604, or the server 608), and may perform communication through the established communication channel.

The communication module 690 may include one or more communication processors that are operable independently of the processor 620 and support direct communication or wireless communication.

In some embodiments, the communication module 690 may include a wireless communication module 692 such as a cellular communication module, a short-range wireless communication module or a global navigation satellite system (GNSS) communication module, or a wired communication module 694 such as a local area network (LAN) communication module or a power line communication module (PLC). In some embodiments, the wireless communication module 692 may include the semiconductor device (1 of FIG. 1) described above. In some embodiments, the processor 620 in conjunction with the memory 630 and the program 640 described above may generate and provide one or more of the control signals CS1-CS3 for controlling the variable capacitors VC1 of each of the various receiving circuits 40-45. In some embodiments, the processor 620 in conjunction with the memory 630 and the program 640 described above may control to change the local oscillator signal LO described above for each of the various receiving circuits 40-45.

A corresponding communication module of these communication modules may perform communication with the external electronic device via the first network 698 (e.g., Bluetooth™, wireless fidelity (Wi-Fi) direct or standard of the Infrared Data Association (IrDA)) or the second network 699 (e.g., a mobile communication network, Internet, a long-range communication network).

These various types of communication modules may be integrated into a single component, or may be implemented as a plurality of separate components. The wireless communication module 692 may identify or authenticate the electronic device 601 within a communication network, such as the first network 698 or the second network 699, by using subscriber information (e.g., International Mobile Subscriber Identifier (IMSI)) stored in the subscriber identification module 696.

The antenna module 697 may transmit or receive a signal or power to or from the outside of the electronic device 601. In some embodiments, the antenna module 697 may include one or more antennas, and at least one antenna suitable for a communication scheme used in the communication network, such as the first network 698 or the second network 699, may be selected from the antennas by the communication module 690. A signal or power may be transmitted or received between the communication module 690 and the external electronic device via the selected at least one antenna.

At least some of the components described above may be interconnected to communicate signals therebetween via an inter-peripheral communication scheme such as bus, general purpose input and output (GPIO), serial peripheral interface (SPI) and mobile industry processor interface (MIPI).

In some embodiments, commands or data may be transmitted or received between the electronic device 601 and an external electronic device 606 via the server 608 connected to the second network 699. The electronic devices 602 and 104 may be the same or different kinds of devices as or from the electronic device 601. All or some of the operations to be executed in the electronic device 601 may be executed in one or more external electronic devices 602, 606 or 608. For example, all or some of the operations to be executed in the electronic device 601 may be executed in one or more external electronic devices 602, 606 or 608.

For example, when the electronic device 601 performs functions or services automatically or in response to a request from a user or another device, the electronic device 601 may request one or more external electronic devices to perform at least a portion of the functions or services instead of executing the functions or services by themselves. The one or more external electronic devices that have received the request may execute at least a portion of the requested functions or services, or an additional function or service associated with the request, and may forward the result of the execution to the electronic device 601. The electronic device 601 provides the result as at least a portion of the response to the request with or without additional process of the result. To this end, cloud computing, distributed computing or client-server computing technologies may be used, for example.

Although the embodiments of the present disclosure have been described with reference to the accompanying drawings, it will be apparent to those skilled in the art that the present disclosure can be fabricated in various forms without being limited to the above-described embodiments and can be embodied in other specific forms without departing from the spirit and essential characteristics of the specification. Thus, the above embodiments are to be considered in all respects as illustrative and not restrictive.

What is claimed is:

1. A semiconductor device comprising:
a first Low Noise Amplifier (LNA) connected to a first receiving port;
a second LNA connected to a second receiving port different from the first receiving port;
a first receiving circuit including a first transformer and configured to process at least one of outputs of the first LNA and the second LNA;
a second receiving circuit configured to process at least one of the outputs of the first LNA and the second LNA; and
a radio frequency (RF) multiplexer configured to control connections between the first LNA and the second LNA, and the first receiving circuit and the second receiving circuit,
wherein the first receiving circuit includes a first variable capacitor having a first end connected to an output of the RF multiplexer and a second end connected to the first transformer.

2. The semiconductor device of claim 1, wherein the first receiving circuit further includes a first mixer, and
the first transformer converts a single signal that is output from at least one of the first LNA or the second LNA into a differential signal and transfers the differential signal to the first mixer.

3. The semiconductor device of claim 2, wherein the first receiving circuit includes:
a first receiving amplifier that receives and amplifies an output of the first mixer, and
a first analog-to-digital converter that performs analog-to-digital conversion with respect to an output of the first receiving amplifier.

4. The semiconductor device of claim 1, wherein a capacitance of the first variable capacitor is changed based on a frequency band of a signal processed by the first receiving circuit.

5. The semiconductor device of claim 4, wherein the first receiving circuit further includes a first mixer, and the capacitance of the first variable capacitor is changed based on a local oscillator signal that is input to the first mixer.

6. The semiconductor device of claim 1, wherein the first receiving circuit further includes a second variable capacitor that is configured to adjust a tuning range of the first transformer and that is connected between output ends of the first transformer.

7. The semiconductor device of claim 1, wherein the first receiving circuit further includes a second variable capacitor that is configured to adjust a tuning range of the first transformer, the second variable capacitor having a first end connected to the first transformer and a second end that is grounded.

8. The semiconductor device of claim 1, wherein the first variable capacitor includes:
a second switch that connects the output of the RF multiplexer to a first end of a first capacitor that has a first capacitance;
a third switch that connects the output of the RF multiplexer to a first end of a second capacitor that has a second capacitance different from the first capacitance; and a first switch that connects the output of the RF multiplexer to a second end of the first capacitor and to a second end of the second capacitor to bypass the first capacitor and the second capacitor.

9. The semiconductor device of claim 8, wherein:

the first switch is controlled by a first control signal, the second switch is controlled by a second control signal, the third switch is controlled by a third control signal, and values of the first control signal, the second control signal, and the third control signal are changed based on a frequency band of a signal processed by the first receiving circuit.

10. The semiconductor device of claim 9, wherein the first receiving circuit further includes a first mixer, and the values of the first control signal, the second control signal, and the third control signal are changed based on a local oscillator signal that is input to the first mixer.

11. The semiconductor device of claim 1, wherein a length of a first line used when the RF multiplexer connects the first LNA with the first receiving circuit is different from a length of a second line used when the RF multiplexer connects the first LNA with the second receiving circuit.

12. A semiconductor device comprising:

a first Low Noise Amplifier (LNA) connected to a first receiving port;

a second LNA connected to a second receiving port different from the first receiving port;

a first receiving circuit including a first transformer and configured to process at least one of outputs of the first LNA and the second LNA;

a second receiving circuit configured to process at least one of the outputs of the first LNA and the second LNA; and an RF multiplexer configured to control connections between the first LNA and the second LNA, and the first receiving circuit and the second receiving circuit, wherein the first receiving circuit includes a first capacitor having a first end connected to an output of the RF multiplexer and a second end connected to the first transformer, the first capacitor having a first capacitance, and the second receiving circuit includes a second transformer and a second capacitor having a first end connected to the output of the RF multiplexer and a second end connected to the second transformer, the second capacitor having a second capacitance different from the first capacitance.

13. The semiconductor device of claim 12, wherein a frequency band of a signal processed by the first receiving circuit is different from a frequency band of a signal processed by the second receiving circuit.

14. The semiconductor device of claim 12, wherein:

the first receiving circuit includes a first mixer, the second receiving circuit includes a second mixer, and a local oscillator signal that is input to the first mixer is different from a local oscillator signal that is input to the second mixer.

15. The semiconductor device of claim 12, wherein the first receiving circuit includes a variable capacitor that is configured to adjust a tuning range of the first transformer and that is connected between output ends of the first transformer.

16. A semiconductor device comprising:

a first Low Noise Amplifier (LNA) connected to a first receiving port;

a second LNA connected to a second receiving port different from the first receiving port;

a first receiving circuit including a first transformer and configured to process at least one of outputs of the first LNA and the second LNA;

a second receiving circuit configured to process at least one of the outputs of the first LNA and the second LNA; and an RF multiplexer configured to control connections between the first LNA and the second LNA, and the first receiving circuit and the second receiving circuit, wherein the first receiving circuit includes:

a second switch that transfers the output of the RF multiplexer to the first transformer through a first capacitor having a first capacitance;

a third switch that transfers the output of the RF multiplexer to the first transformer through a second capacitor having a second capacitance different from the first capacitance; and a first switch that connects the output of the RF multiplexer to a second end of the first capacitor and to a second end of the second capacitor to bypass the first capacitor and the second capacitor.

17. The semiconductor device of claim 16, wherein:

the first switch is controlled by a first control signal, the second switch is controlled by a second control signal, the third switch is controlled by a third control signal, and values of the first control signal, the second control signal, and the third control signal are changed based on a frequency band of a signal processed by the first receiving circuit.

18. The semiconductor device of claim 17, wherein the first receiving circuit further includes a first mixer, and the values of the first control signal, the second control signal, and the third control signal are changed based on a local oscillator signal that is input to the first mixer.

19. The semiconductor device of claim 16, wherein the first receiving circuit further includes a variable capacitor that is configured to adjust a tuning range of the first transformer and that is connected between output ends of the first transformer.

20. The semiconductor device of claim 16, wherein the first receiving circuit includes a variable capacitor that is configured to adjust a tuning range of the first transformer, the variable capacitor having a first end connected to the first transformer and a second end that is grounded.

\* \* \* \* \*